United States Patent [19]

Scholian

[11] Patent Number: 4,794,251
[45] Date of Patent: Dec. 27, 1988

[54] APPARATUS FOR MEASURING LENGTHS OR ANGLES

[75] Inventor: Thomas Scholian, Rombach, Switzerland

[73] Assignee: Kern & Company Ltd., Aarau, Switzerland

[21] Appl. No.: 121,796

[22] Filed: Nov. 17, 1987

[30] Foreign Application Priority Data

Nov. 19, 1986 [CH] Switzerland ............ 04624/86

[51] Int. Cl.$^4$ ............ G01D 5/34; H01J 3/14
[52] U.S. Cl. ............ 250/231 SE; 250/237 G; 341/9; 341/13
[58] Field of Search ............ 250/231 SE, 237 G; 340/347 P; 356/395, 373, 375; 33/125 A, 125 C

[56] References Cited

U.S. PATENT DOCUMENTS 4,097,875 6/1978 Scholten et al. ............ 250/231 SE
4,529,964 7/1985 Minami et al. ............ 250/231 SE
4,616,131 10/1986 Burkhardt ............ 250/231 SE
4,654,524 3/1987 Kita ............ 340/347 P Primary Examiner—David C. Nelms
Assistant Examiner—Michael Messinger
Attorney, Agent, or Firm—Burns, Doane, Swecker & Mathis

[57] ABSTRACT

An apparatus for measuring differences by incrementally counting graduations has additional equidistant graduations as well as a corresponding sensor and evaluation device. The intervals between the marks of each additional graduation are multiples of one interval of an incremental graduation. The intervals of one additional graduation differ from those of others by an integral number of incremental intervals. A simple determination of the absolute position of marks from a zero position is done by using an incremental counter for counting the steps between successive marks of two of the additional graduations. This method requires only small motions of the carrier and sensing of the zero position itself is not required.

8 Claims, 4 Drawing Sheets

4,794,251

APPARATUS FOR MEASURING LENGTHS OR ANGLES

BACKGROUND OF THE INVENTION

The present invention relates to an apparatus for measuring lengths or angles. The apparatus comprises a carrier for graduations, including a first incremental graduation having equal intervals as well as other graduations for obtaining values of positions with respect to a zero position. This apparatus also comprises a sensing and evaluating circuit with a sensor device that is movable with respect to the carrier, for sensing the graduations.

Known apparatus of this type have various types of graduations for obtaining absolute measured values with respect to a zero position. German Patent Application DE-A1 No. 3039483 (Heidenhain GmbH) discloses a carrier having an incremental graduation as well as a track of reference marks and a code track. The marks of the code track are used to identify the respective reference marks. German Patent DE-C No. 2416212 (Contraves) discloses a carrier having an incremental graduation as well as a track of absolute marks. Each absolute mark has its own distance from the next following one, this distance characterizing the distance of that mark from a zero position.

One object of the present invention is to provide an apparatus for measuring lengths or angles with a carrier having only graduations with equally distant marks, and operating such that a determination of absolute distance from a zero position is possible by scanning only a limited part of the total graduation just as one does with coded marks.

SUMMARY OF THE INVENTION

An implementation of the invention employs an apparatus including a carrier for graduations having a first incremental graduation with equal intervals; a second graduation parallel to the first incremental graduation and having marks with equal intervals; and a third graduation parallel to the first incremental graduation and having marks with equal intervals.

A sensing and evaluating circuit includes a sensor device movable with respect to the carrier for a length or an angle to be measured, to sense the graduations. The sensing and evaluating circuit also includes a counter for counting incremental pulses generated by the sensing and evaluating circuit and corresponding to the marks of the first incremental graduation passing by the sensor device. The sensing and evaluating circuit determines the number of incremental pulses counted by the counter between the passage at the sensor device of any mark of the second graduation and at least one succeeding mark of the third graduation. The number of incremental pulses indicate the distance from a zero position of the mark of the second graduation, the distance from a zero position, and the distance between a position on the carrier and the zero position from the distance of the mark of the second graduation from a zero position and from the incremental sum stored in the counter.

According to one feature of the invention the intervals between the marks of the second graduation differ from the intervals between the marks of the third graduation by an integral number of intervals of the incremental graduation, such that the product of the total number of the smaller intervals on the carrier times the difference between a smaller and a greater interval is always smaller than one half of a greater interval. The sensing and evaluating circuit obtains the number of incremental pulses between any mark of the second graduation and the succeeding mark of the third graduation with its correct sign.

According to another feature of the invention the sensor device is a photoelectric sensor device and the graduations are sensed by the photoelectric sensor. Each of the marks with equal intervals of the second and third graduations consists of several graduation lines and extends over several intervals of the first incremental graduation. The photoelectric sensor has photoelectric transducers corresponding to the marks and generates a corresponding pulse at the passage of each mark, each of the corresponding pulses being coincident with one of the incremental counting pulses.

According to still another feature, the sensing and evaluating circuit comprises a buffer memory and a processor stage. The first sensed mark of the second graduation after the beginning of operation of the apparatus effects a reset and enable of the counter for the incremental pulses. Each following sensed mark of the third graduation effects a transfer of the instant count of the incremental counter to the buffer memory. These instant counts indicate the absolute position of the first sensed mark on its carrier. The processor stage obtains the absolute position from the instant counts stored in the buffer and also obtains the measured value with respect to a zero position from the absolute position and any count result transferred from the incremental counter.

These objects and many other advantages of the present invention will be readily apparent to one skilled in the pertinent art from the following detailed description of a preferred embodiment of the invention and the appended claims when considered in conjunction with the drawings.

DETAILED DESCRIPTION OF A PREFERRED EMBODIMENT

Figure 1:
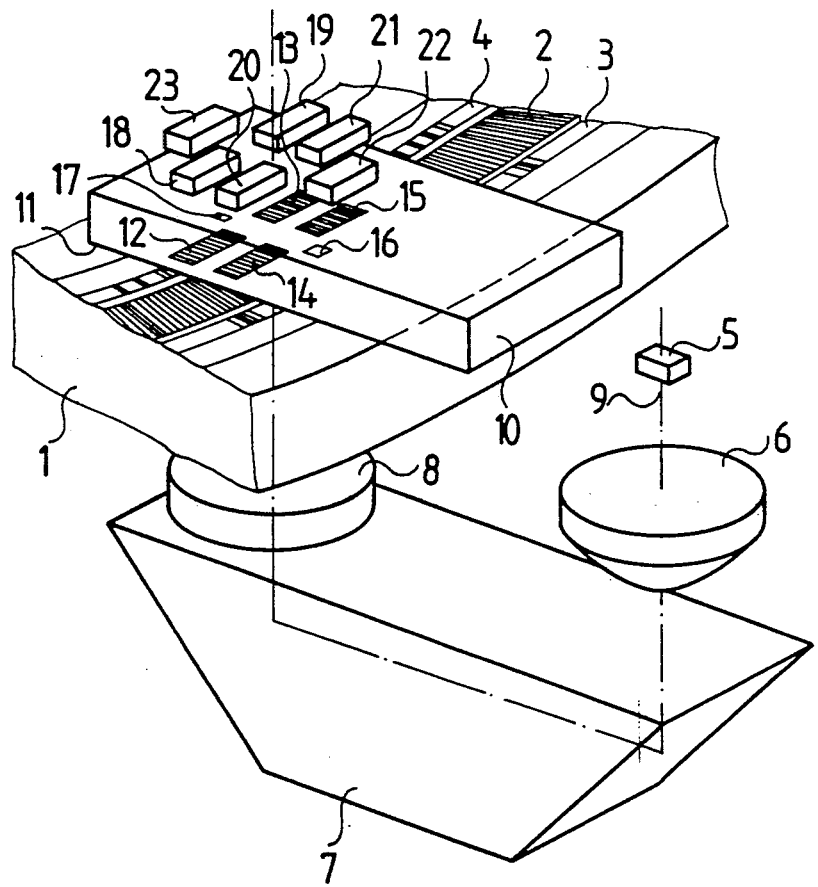
FIG. 1 is a perspective view of a carrier with several graduations and a corresponding sensor device of an electro-optical shaft angle encoder according to the invention.

FIG. 1 shows a section of a graduated disk 1 of a shaft angle encoder. The disk 1 is carried on a rotatable axial shaft whose angular position is to be measured. Three graduations are provided on the disk 1, namely a first incremental graduation 2 and second and third graduations 3 and 4 having equidistant marks, shown more in detail in FIG. 2. A fixedly mounted sensor device is provided for electro-optically sensing the graduations 2, 3 and 4 of disk 1. The sensor device comprises a light emitting diode 5 to the side and slightly above disk 1. The optical radiation of diode 5 is collimated by a collimator lens 6 on an optical axis 9. The resulting ray path is deviated by a prism 7 and then it is conducted via an illumination lens 8 and through the transparent body of disk 1 from below on to the opaque graduations 2, 3 and 4 of disk 1.

A sensor plate 10 is provided immediately above the graduations 2, 3 and 4. The sensor plate 10 has a transparent body carrying on its lower side a sensor mask 11. The sensor mask 11 is opaque and has four apertures 12, 13, 14 and 15 each provided with a sensor grating for sensing the incremental graduation 2.

For sensing the second and third graduations 3 and 4 two apertures 16, 17 are provided in the sensor mask 11, the apertures 16 and 17 each having a structure corresponding to the structure of the marks of graduations 3 or 4 respectively. The light components coming through the sensor plate 10 impinge on six photoelectric transducers 18 to 23 associated with the apertures 12 to 17 respectively.

Figure 2:
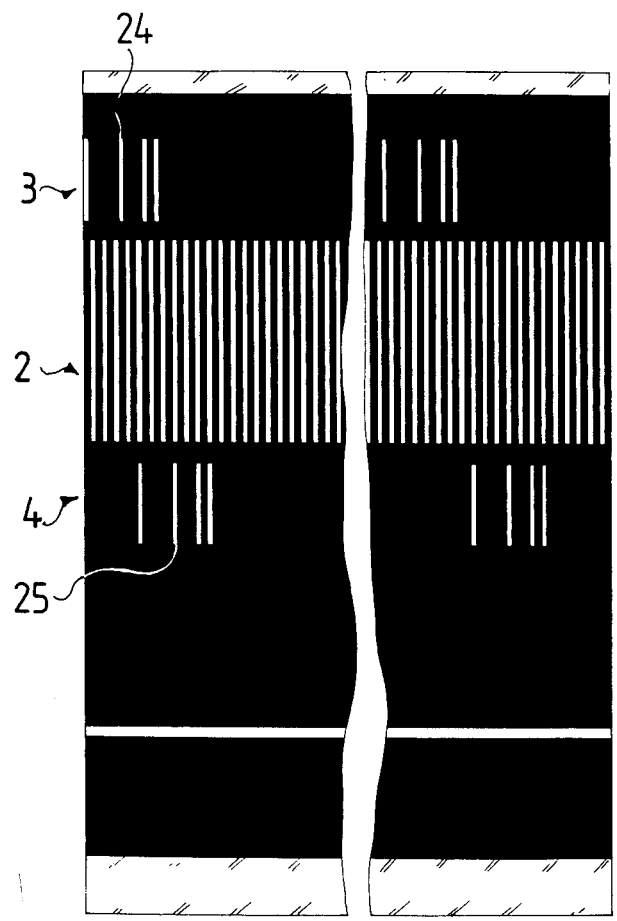
FIG. 2 is a plan view of the graduations of FIG. 1 in detail.

The incremental graduation 2 is made up of a large number, e.g. 4096, lines of equal breadth having 4096 spacings of the same breadth in a manner known as such and shown in detail in FIG. 2. The sensor gratings provided within the apertures 12 to 15 are copies of sections of the incremental graduation 2. The sensor gratings are mounted parallel to graduation 2 but with phase shifts between one another. If the disk 1 is rotated around its shaft, the light coming through each aperture 12 to 15 undergoes a periodic and homogeneous variation over the respective aperture. If one cycle of the variation corresponds to 360 degrees, the phase of aperture 12 is 0 degrees, the phase of aperture 13 is 90 degrees, the phase of aperture 14 is 180 degrees and the phase of aperture 15 is 270 degrees. Thus, the electric output signals of the photoelectric transducers 18 to 21 also occur with the phases 0, 90, 180 and 270 degrees respectively. If the signals are sinusoidal they may be represented in a known manner by the functions sin, cos, (−sin), (−cos).

As shown in FIG. 2, each one of the equidistant marks 24, 25 of the second and third graduations 3, 4 consists of a combination of lines, each mark extending over several periods of the first incremental graduation 2. Whenever such a mark 24, 25 passes beneath its corresponding aperture 16 or 17 of mask 11, the corresponding photoelectric transducer 22 of 23 generates a mark pulse. Each such mark pulse is made to coincide with an incremental pulse derived from the transducers 18 to 21. As shown in FIG. 2 the mark 25 of graduation 4 is shifted by an integral number of incremental periods of graduation 2 with respect to mark 24 of graduation 3. This shift is caused to vary from mark to mark because the intervals of graduation 3 differ from those of graduation 4 by an integral number of incremental periods, although within each graduation the marks are equidistant.

Figure 3:
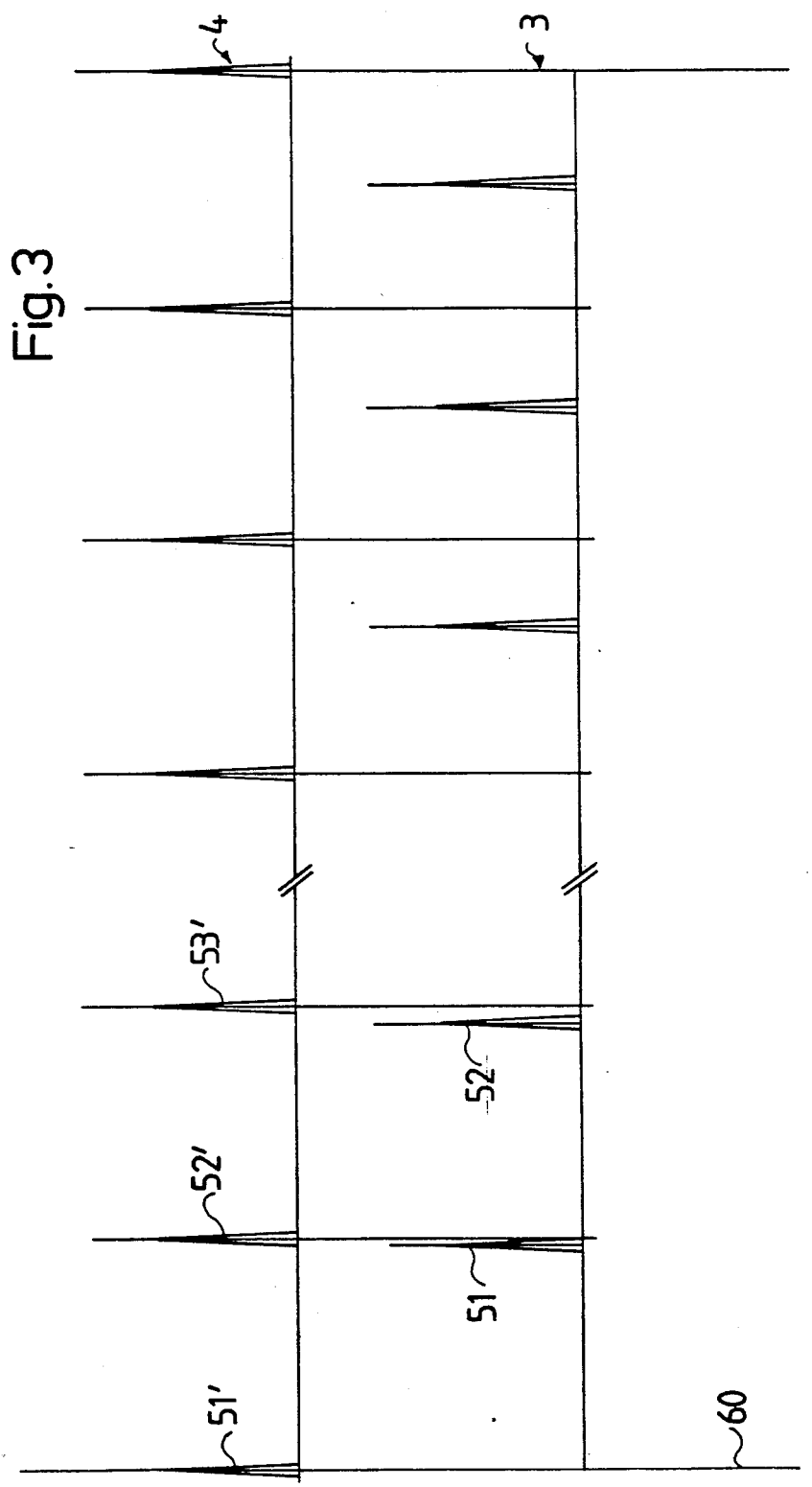
FIG. 3 schematically illustrates the mutual position of the graduation marks shown in FIG. 2.

The mutual position of the total graduations 3 and 4 is schematically illustrated in FIG. 3. Although the horizontal axis is shown as being rectilinear it is meant to represent the angular position on the divided disk 1 from a zero position 60 up to 360 degrees. Over this full circle the graduation 2 comprises 4096 incremental intervals, graduation 3 comprises 32 marks with equal intervals of 126 incremental intervals, and graduation 4 also comprises 32 marks with equal intervals of 128 incremental intervals each. Thus there are progressively diminishing between the marks of graduations 3 and 4 as shown in FIG. 3. The angular distance between marks 51, 51' is 127, between marks 52, 52' it is 125 incremental intervals and so on up to 65 incremental intervals. The angular distance between corresponding marks of the equidistant graduations 3 and 4 thus characterizes each mark as well as its distance from the zero position 60 shown on the left side of the graduations 3 and 4 in FIG. 3. These distances from zero for the marks 51, 52 etc. of graduation 3 are 127, 253, etc. up to 4033 incremental intervals and for the marks 51', 52' etc. of graduation 4 are 0, 128, 256 etc. up to 3968 incremental intervals for the 32nd mark in both cases.

Figure 4:
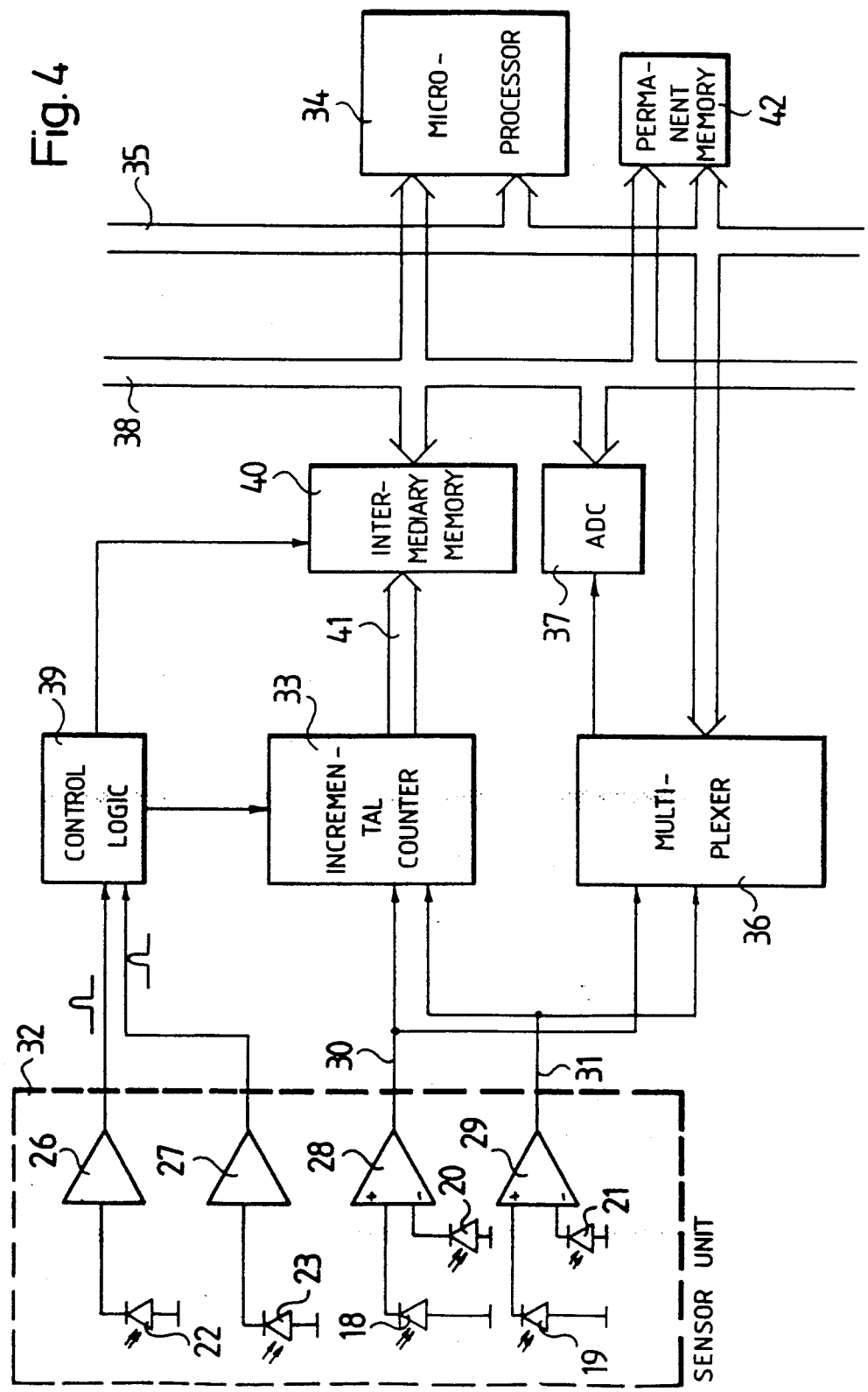
FIG. 4 is a block circuit diagram of a sensing and evaluation circuit for the apparatus shown in FIG. 1.

As an example of the operation of the invention, it is assumed that after switching on the apparatus, the distance between a certain mark of the graduation 4 and the next following mark of the graduation 3 in a forward direction is counted to be 123 incremental units. By means of a suitable algorithm or look-up table it may be found that the third mark has been sensed on both graduations of which the distance from zero 60 is 256 incremental intervals on graduation 4 and 379 on graduation 3. The subsequent measurement of any angular position is then done by incremental counting starting at the value 256. An evaluation circuit for such a measurement is diagrammatically shown in FIG. 4. The photoelectric transducers 18 to 23 from FIG. 1 are integrated with corresponding signal amplifiers 26 to 29 in a sensor unit 32 mounted in a plane with the light emitting diode 5 shown in FIG. 1.

The output signals of the photoelectric transducers 18, 20 and 19, 21 are connected in a differential manner to differential amplifiers 28 and 29. This is done in a manner known as such to eliminate equal phase and DC-components to obtain a pure AC "sinewave" signal 30 and a "cosinewave" signal 31 with a mutual phase shift of 90 degrees. These signals 30 and 31 undergo periodic changes proportional to the rotation of the graduated disk 1, the periods being counted with their correct sign by an incremental counter 33. If the rotation of disk 1 stops at an angular position to be measured, the stationary values of signals 30, 31 are stored for interpolation between the incremental counts. The stationary values are read out of a multiplexer 36 controlled by a microprocessor 34 via an address bus 35. The stationary values are transferred from multiplexer 36 via an analog to digital converter 37 and a data and control bus 38 to microprocessor 34. The correct measured angle is computed by microprocessor 34 from the incremental sums of counter 33 and fractional periods obtained from the stationary values from data and control bus 38.

To obtain a zero reference for the incremental sums of counter 33, the output signals of photoelectric transducers 22, 23 are fed to a control logic 39 each via a signal amplifier 26 and 27 respectively. The logic 39 generates both reset signals for the incremental counter 33 and transfer signals for transfer of count values from counter 33 via a bus 41 to a counter 40 acting as an intermediary memory.

The function of the above described evaluation circuit is as follows:

After switching on the measuring apparatus, the graduated disk 1 is rotated until the sensor unit 32 with transducers 22, 23 has sensed at least one mark of each graduation 3 and 4. The signal pulse corresponding to the first sensed mark effects a reset to zero of the incremental counter 33 which then continues counting the incremental pulses of graduation 2 until the second mark is sensed. The signal pulse corresponding to the second sensed mark effects via control logic 39 a transfer and storage of the instant incremental sum of counter 33 into memory 40, while the counter 33 continues counting as rotation of disk 1 continues. The instant sum is then transferred from memory 40 via control and data bus 38 to microprocessor 34. By means of information from a permanent memory 42 and the instant sum the distance from zero of the first sensed mark is obtained by microprocessor 34. For each following measurement the respective incremental sum from counter 33 is corrected to refer to zero by means of the zero distance of the first sensed mark. For the example described with reference to FIG. 3, the above mentioned instant sum has been assumed to be 123, leading to a distance from zero of the first sensed mark of 256.

The invention has been described with reference to a particular preferred embodiment, but variations within the scope of the invention will now become apparent to those skilled in the art. The above described absolute reference to a zero position is only one object of the invention among others. Another one is to check for errors of the incremental count. If the intervals between the marks of the second or third graduations 3, 4 of disk 1 are made to be suitable integral multiples of one incremental interval, e.g. one mark interval equal to 128 incremental intervals, an error check of the incremental count is possible on each occurrence of a mark pulse of only one graduation by means of a simple electronic circuit. Another object of the invention is to select only certain preprogrammed marks of a second or third graduation for signal processing by a programmable logic which selects the corresponding sensor pulses. Still another object is to enlarge, if necessary, the range of measured values with absolute zero reference by providing a fourth graduation on disk 1 having intervals equal to the second or third graduation but with phase jumps in order to characterize certain groups of marks of the second or third graduation.

Such groups may have zero distances e.g. between 0 and 4096 or between 4097 and 8192 incremental intervals, etc.

The above described electro-optical sensor system with transmitted illumination of the graduated disk 1 may also be a system with reflected illumination, e.g. for metallic graduation carriers or it may be a capacitive or inductive system, e.g. the well known inductosyn system.

As compared to known systems mentioned in the Background of the Invention, which characterize the absolute position of a sensed mark by the distance from its neighbor marks within the same graduation, one advantage of the invention is a greater number of absolutely detectable positions due to a greater number of equidistant graduation marks over a given scale length. As compared to known systems, which characterize the absolute position of a code mark by the structure of the mark itself, an apparatus according to the invention has a simple evaluation without identifier circuits with shift registers or similar devices. To identify the absolute distances of the marks from zero, use is made of an incremental counter already required for measuring differences of positions. This incremental counter according to the invention is completed only by a simple control logic and a preprogrammed algebraic algorithm. Because the second and third graduations have marks of only one type there are also corresponding pulses of only one type, thereby facilitating evaluation.

What is claimed is:

1. Apparatus for measuring lengths or angles comprising:

a carrier including a first incremental graduation having equal intervals, a second graduation parallel to said first incremental graduation and having marks with equal intervals, and a third graduation parallel to said first incremental graduation and having marks with equal intervals;

a sensor device movable with respect to said carrier for a distance to be measured to sense said graduations and generate pulses corresponding thereto;

a counter for counting incremental pulses generated by said sensor device corresponding to the marks of said first incremental graduation passing by said sensor device; and an evaluating circuit including control means for causing said counter to count the number of incremental pulses between the passage at said sensor device of any mark of said second graduation and at least one succeeding mark of said third graduation, means for determining the distance from a zero position of said mark of the second graduation on the basis of said number of pulses, and means for determining the distance between a position on said carrier and said zero position on the basis of the determined distance of said mark of the second graduation from the zero position and the sum of pulses counted by said counter.

2. Apparatus as claimed in claim 1, wherein the intervals between the marks of the second graduation differ from the intervals between the marks of the third graduation by an integral number of intervals of the first incremental graduation, such that the product of the total number of the smaller intervals on the carrier times the difference between a smaller and a greater interval is less than one-half of a greater interval, and wherein the evaluating circuit determines the proper sign of the number of incremental pulses between any mark of the second graduation and the succeeding mark of the third graduation.

3. Apparatus as claimed in claim 2, wherein each interval of said second graduation extends over an integral number of intervals of said first incremental graduation.

4. Apparatus as claimed in claim 1, wherein said sensor device includes a photoelectric sensor which senses said graduations, each of said marks with equal intervals of the second and third graduations consisting of several graduation lines and extending over several intervals of the first incremental graduation, said photoelectric sensor having photoelectric transducers corresponding to said marks and generating at the passage of each mark a corresponding pulse, each of said corresponding pulses being coincident with one of said incremental pulses.

5. Apparatus as claimed in claim 1, wherein the intervals of said second graduation differ from those of said third graduation, and further including a fourth graduation parallel to said first incremental graduation on said carrier, said fourth graduation having intervals equal to those of said second graduation and marks provided with phase jumps in order to characterize certain groups of marks of said second graduation by their separations from the marks of the fourth graduation.

6. Apparatus as claimed in claim 2, wherein said evaluating circuit comprises a buffer memory and a processor stage, and wherein said control means causes the first sensed mark of said second graduation after the beginning of operation of the apparatus to effect a reset and enable of said counter for the incremental pulses, and each following sensed mark of said third graduation effects a transfer of the instant count of the incremental counter to said buffer memory, said instant counts characterizing the absolute position of said first sensed mark on said carrier, and wherein said processor stage determines said absolute position from the instant counts stored in the buffer and deterines distance from said zero position on the basis of said absolute position and a count result transferred from the incremental counter.

7. Apparatus as claimed in claim 2, wherein said sensor device is a photoelectric sensor which senses said graduations, each of said marks with equal intervals of the second and third graduations consisting of several graduation lines and extending over several intervals of the first incremental graduation, said photoelectric sensor having photoelectric transducers corresponding to said marks and generating at the passage of each mark a corresponding pulse, each of said corresponding pulses being coincident with one of said incidental pulses.

8. Apparatus as claimed in claim 7, wherein each interval of said second graduation extends over an integral number of intervals of said first incremental graduation.

* * * * *